United States Patent
Lee

(10) Patent No.: US 8,922,542 B2
(45) Date of Patent: Dec. 30, 2014

(54) CHIP-ON-FILM PACKAGE AND DISPLAY DEVICE HAVING THE SAME

(71) Applicant: Hee Kwon Lee, Yongin (KR)

(72) Inventor: Hee Kwon Lee, Yongin (KR)

(73) Assignee: Samsung Display Co., Ltd., Yongin-City, Gyeonngi-Do (KR)

( * ) Notice: Subject to any disclaimer, the term of this patent is extended or adjusted under 35 U.S.C. 154(b) by 0 days.

(21) Appl. No.: 13/959,910

(22) Filed: Aug. 6, 2013

(65) Prior Publication Data
US 2014/0312486 A1  Oct. 23, 2014

(30) Foreign Application Priority Data
Apr. 19, 2013 (KR) .......... 10-2013-0043794

(51) Int. Cl.
G06F 3/038 (2013.01)
G09G 5/00 (2006.01)
H01L 23/14 (2006.01)
H01L 23/34 (2006.01)

(52) U.S. Cl.
CPC .............. H01L 23/34 (2013.01); H01L 23/14 (2013.01)
USPC .............................. 345/211; 345/204; 345/87

(58) Field of Classification Search
CPC . H05K 2203/00; H01L 21/00; G09G 2300/00
USPC .......................................... 345/211, 204, 87
See application file for complete search history.

(56) References Cited

U.S. PATENT DOCUMENTS

2010/0149159 A1  6/2010 Kim
2011/0122337 A1* 5/2011 Shimizu et al. ............... 349/61

FOREIGN PATENT DOCUMENTS

KR  10-2005-0112762 A  12/2005
KR  10-2010-0067862 A  6/2010

* cited by examiner

*Primary Examiner* — Telly Green
(74) *Attorney, Agent, or Firm* — Lee & Morse, P.C.

(57) ABSTRACT

A chip-on-film package and a display device, the package including a base film that includes an upper surface and a lower surface, the lower surface facing the upper surface; an integrated circuit chip on the upper surface of the base film; an alignment line on the base film and being spaced apart from the integrated circuit chip; a heat discharge plate on the lower surface of the base film and having a plate shape; and at least one via pattern penetrating through the base film and electrically connecting the alignment line to the heat discharge plate.

14 Claims, 8 Drawing Sheets

CHIP-ON-FILM PACKAGE AND DISPLAY DEVICE HAVING THE SAME

CROSS-REFERENCE TO RELATED APPLICATION

Korean Patent Application No. 10-2013-0043794, filed on Apr. 19, 2013, in the Korean Intellectual Property Office, and entitled: "Chip-On-Film Package and Display Device Having the Same," is incorporated by reference herein in its entirety.

BACKGROUND

1. Field

Embodiments relate to a chip-on-film package and a display device having the same.

2. Description of the Related Art

A display device may include a display panel, a printed circuit board that drives the display panel, and a tape carrier package or a chip-on-film (hereinafter, referred to as COF) package that electrically connects the display panel and the printed circuit board.

SUMMARY

Embodiments are directed to a chip-on-film package and a display device having the same.

The embodiments may be realized by providing a chip-on-film package including a base film that includes an upper surface and a lower surface, the lower surface facing the upper surface; an integrated circuit chip on the upper surface of the base film; an alignment line on the base film and being spaced apart from the integrated circuit chip; a heat discharge plate on the lower surface of the base film and having a plate shape; and at least one via pattern penetrating through the base film and electrically connecting the alignment line to the heat discharge plate.

The alignment line may include an alignment mark at an end portion thereof.

The chip-on-film package may further include a first protective layer on the upper surface of the base film and the alignment line, the first protective layer covering the alignment line; and a second protective layer on the lower surface of the base film and the heat discharge plate, the second protective layer covering the heat discharge plate.

The first protective layer may include an exposure hole therethrough that exposes the alignment mark.

The alignment line may extend in a first direction and is spaced apart from the integrated circuit chip in a second direction, the second direction being different from the first direction when viewed in a plan view.

The at least one via pattern may be provided in a plural number, and the via patterns may be spaced apart from each other in the first direction.

The embodiments may also be realized by providing a display device including a display panel that displays an image; a printed circuit board that drives the display panel; a chip-on-film package that electrically connects the printed circuit board to the display panel; and a chassis that accommodates the display panel, the printed circuit board, and the chip-on-film package, the chassis applying a ground signal to the printed circuit board, wherein the chip-on-film package includes a base film that includes an upper surface and a lower surface, the lower surface facing the upper surface; an integrated circuit chip on the upper surface of the base film; an alignment line on the base film and being spaced apart from the integrated circuit chip; a heat discharge plate on the lower surface of the base film and having a plate shape; and at least one via pattern penetrating through the base film and electrically connecting the alignment line to the heat discharge plate.

The alignment line may include a first alignment mark at an end portion thereof.

The printed circuit board may include a driving board; and a second alignment mark on the driving board, the second alignment mark facing the first alignment mark and making contact with the first alignment mark.

The printed circuit board may further include a ground line on the driving board, the ground line being electrically connected to the second alignment mark.

The chassis may include a chassis frame that includes a bottom portion and a sidewall portion, the sidewall portion extending upwardly from the bottom portion; and a ground pad on the bottom portion, the ground pad making contact with the ground line.

The ground pad may be applied with a ground signal.

The alignment line may extend in a first direction and is spaced apart from the integrated circuit chip in a second direction, the second direction being different from the first direction when viewed in a plan view.

The at least one via pattern may be provided in a plural number of via patterns, and the via patterns may be spaced apart from each other in the first direction.

The display device may further include a first protective layer on the upper surface of the base film and the alignment line, the first protective layer covering the alignment line; and a second protective layer on the lower surface of the base film and the heat discharge plate, the second protective layer covering the heat discharge plate.

The first protective layer may include an exposure hole therethrough that exposes the first alignment mark.

The chassis may include a chassis frame that includes a bottom portion and a sidewall portion, the sidewall portion extending upwardly from the bottom portion; a first ground pad on the bottom portion, the first ground pad making contact with the ground line; and a second ground pad on the bottom portion, the second ground pad being spaced apart from the first ground pad.

The first ground pad and the second ground pad may receive a ground signal.

The display device may further include a first protective layer on the upper surface of the base film and the alignment line, the first protective layer covering the alignment line; and a second protective layer on the lower surface of the base film and the heat discharge plate, the second protective layer including a recess therethrough that exposes a portion of the heat discharge plate.

The second ground pad may make contact with the heat discharge plate through the recess.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
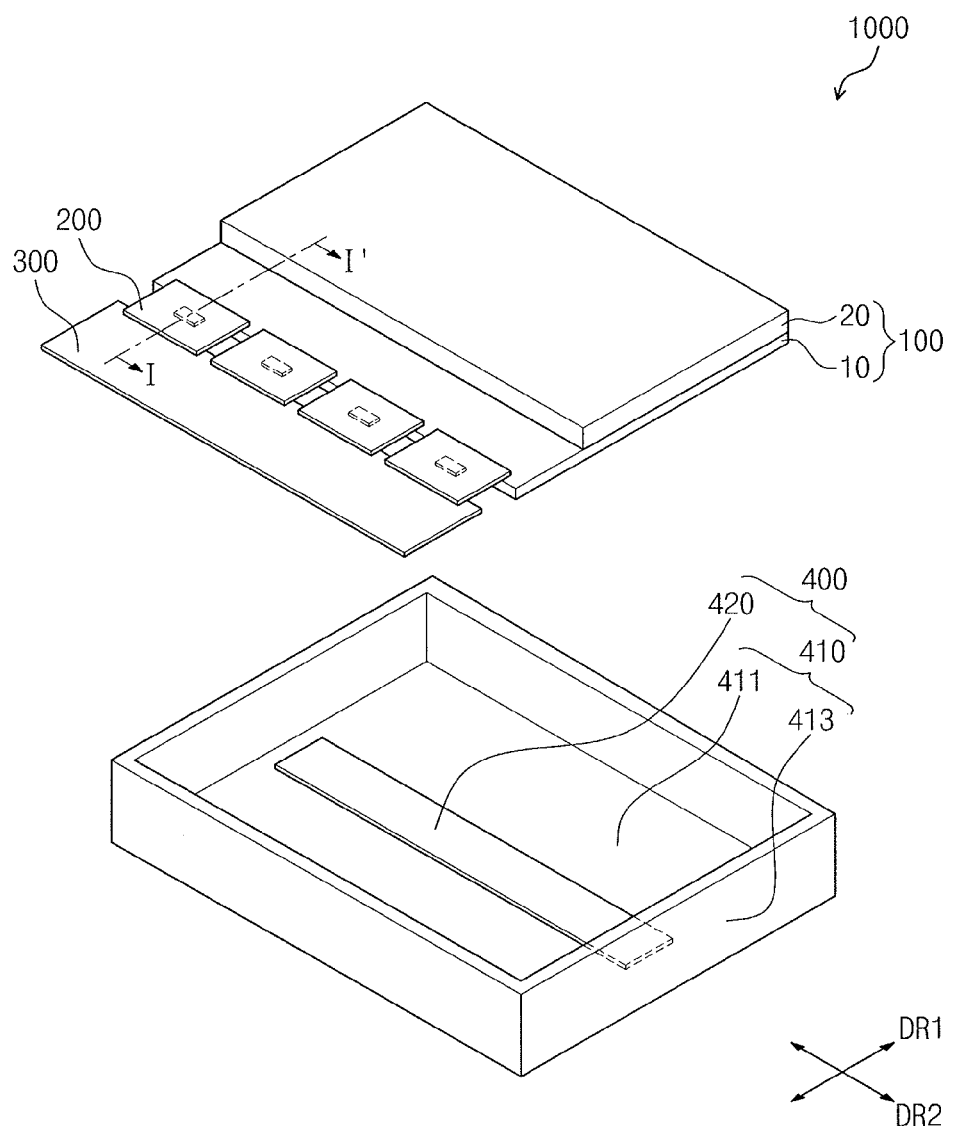
FIG. 1 illustrates an exploded perspective view of a display device according an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
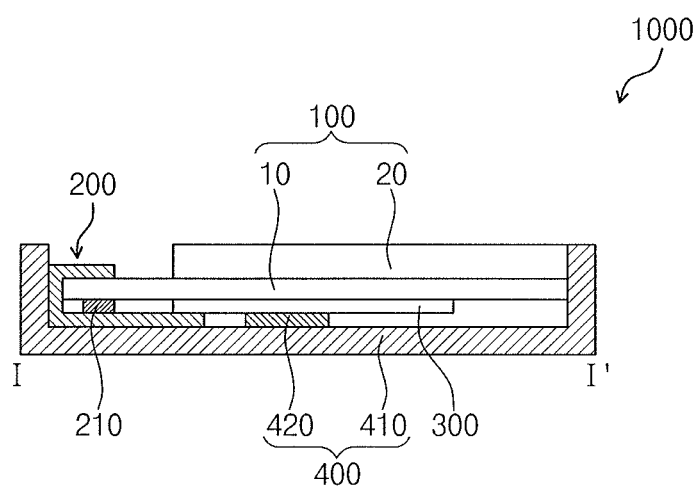
FIG. 2 illustrates a cross-sectional view taken along a line I-I' of FIG. 1.

FIG. 1 illustrates an exploded perspective view of a display device 1000 according an exemplary embodiment. FIG. 2 illustrates a cross-sectional view taken along a line I-I' of FIG. 1.

Referring to FIGS. 1 and 2, the display device 1000 may include a display panel 100, a chip-on-film (hereinafter, referred to as COF) package 200, a printed circuit board 300, and a chassis 400.

The display panel 100 may be a suitable display panel, e.g., an organic light emitting display panel, a liquid crystal display panel, a plasma display panel, an electrophoretic display panel, an electrowetting display panel, or the like. In the present exemplary embodiment, the organic light emitting display panel will be described as the display panel 100.

The display panel 100 displays an image. The display panel 100 may include a first substrate 10 and a second substrate 20. The first substrate 10 may include a plurality of pixels arranged in a matrix form thereon. In addition, the first substrate 10 may further include a gate driver (not shown) and a data driver (not shown) to drive the pixels.

When viewed in a plan view, the first substrate 10 may have an area that is wider than that of the second substrate 20. A pad electrode (not shown) may be on the first substrate 10, e.g., corresponding to an area that is not overlapped with the second substrate 20. The pad electrode (not shown) may be electrically connected to the gate driver and the data driver. A signal applied to the pad electrode may be applied to the gate driver and the data driver.

The second substrate 20 may be coupled to the first substrate 10 to seal pixels, circuits, and wirings formed on the first substrate 10 from an external environment. Although not shown in FIGS. 1 and 2, the display panel 100 may further include a polarizing film attached to a surface of the second substrate 20 to help prevent external light from being reflected.

The COF package 200 may electrically connect the printed circuit board 300 to the display panel 100. The COF package 200 may include a base film (not shown) and an integrated circuit chip 210 on the base film.

One end portion (in a first direction DR1) of the COF package 200 may be bonded to the pad electrode to be connected to the display panel 100, and another end portion in (the first direction DR1) of the COF package 200 may be electrically connected to the printed circuit board 300.

FIG. 1 shows four COF packages arranged in a second direction DR2 (substantially perpendicular to the first direction DR1) and spaced apart from each other, but a number of the COF packages should not be limited to four.

The COF package 200 may be bent to have a C shape or a rotated U shape, and may be mounted on a rear side of the display panel 100. For example, the COF package 200 may extend from an upper surface of the first substrate 10 along a side surface of the first substrate 10 and may be fixed to a lower surface of the first substrate 10. To this end, the COF package 200 may be flexible.

The printed circuit board 300 may drive the display panel 100. The printed circuit board 300 may include a driving board (not shown) and a plurality of circuits (not shown) mounted on the driving board. The printed circuit board 300 may be mounted on the lower surface of the first substrate 10 while the COF package 200 is bent.

The chassis 400 may include a chassis frame 410 and a ground pad 420.

The chassis frame 410 may include a bottom portion 411 and a sidewall portion 413 extending upwardly from the bottom portion 411. The chassis frame 410 may provide a receiving space, and the display panel 100, the COF package 200, and the printed circuit board 300 may be accommodated in the receiving space.

The ground pad 420 may be on the bottom portion 411. The ground pad 420 may overlap with the printed circuit board 300 accommodated in the receiving space when viewed in a plan view, and may make contact with the printed circuit board 300. FIG. 1 shows one ground pad 420 with a bar shape, but the number and the shape of the ground pads 420 should not be limited thereto or thereby. For example, the ground pad 420 may be provided in a plural number, and the ground pads 420 may be spaced apart from each other to correspond to the COF packages 200, respectively. In an implementation, the ground pad 420 may have a pin shape.

The ground pad 420 may be applied with a ground signal, and the ground signal may be applied to the COF package 200 through the printed circuit board 300 from the ground pad 420.

Figure 3:
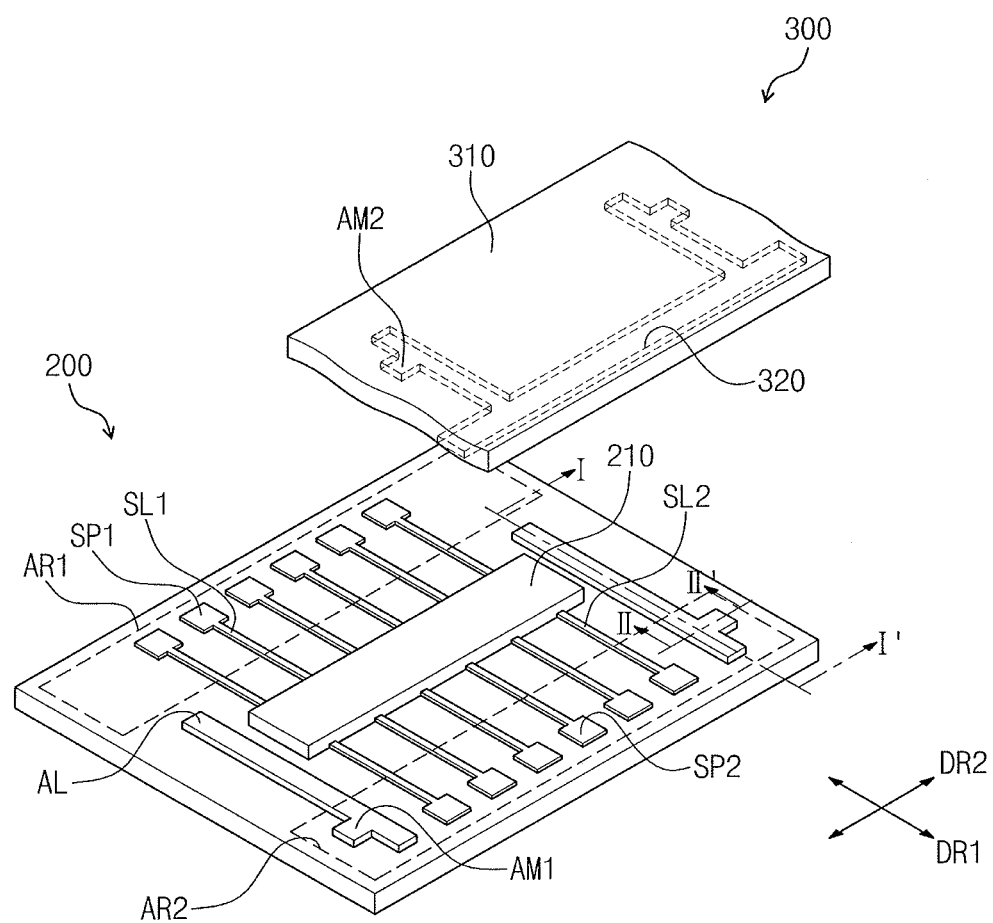
FIG. 3 illustrates an exploded perspective view showing one chip-on-film package and a portion of the printed circuit board of FIG. 1.
Figure 4:
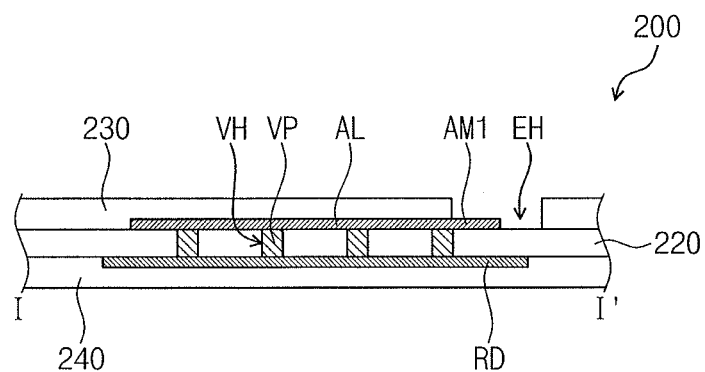
FIG. 4 illustrates a cross-sectional view taken along a line I-I' of FIG. 3 to show the chip-on-film package.
Figure 5:
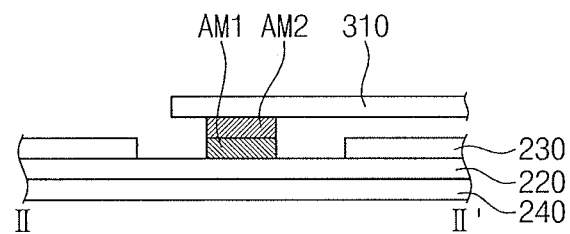
FIG. 5 illustrates a cross-sectional view taken along a line II-II' of FIG. 3.
Figure 6:
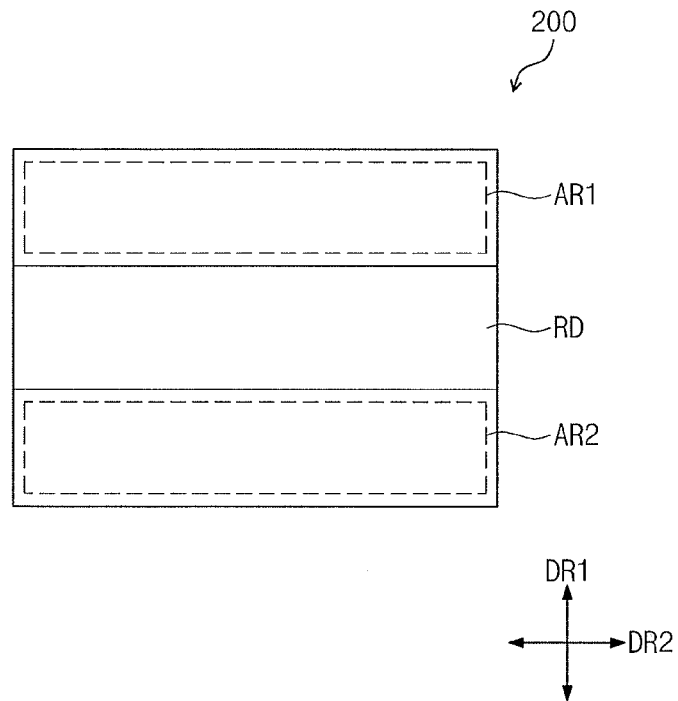
FIG. 6 illustrates a plan view of a rear surface of the chip-on-film package of FIG. 3.

FIG. 3 illustrates an exploded perspective view showing one chip-on-film package and a portion of the printed circuit board of FIG. 1. FIG. 4 illustrates a cross-sectional view taken along a line I-I' of FIG. 3 to show the chip-on-film package. FIG. 5 illustrates a cross-sectional view taken along a line II-II' of FIG. 3. FIG. 6 illustrates a plan view showing a rear surface of the chip-on-film package of FIG. 3.

Referring to FIGS. 3 to 6, the COF package 200 may include the base film 220, the integrated circuit chip 210, an alignment line AL, a heat discharge plate RD, a via pattern VP, a first protective layer 230, and a second protective layer 240.

The COF package 200 may include a first bonding area AR1 and a second bonding area AR2 when viewed in a plan view. The first bonding area AR1 may be bonded to the display panel 100 shown in FIG. 1, and the second bonding area AR2 may be bonded to the printed circuit board 300. Each of the first and second bonding areas AR1 and AR2 may correspond to or be at the end portion of the COF package 200 in the first direction DR1, respectively. The first and second bonding areas AR1 and AR2 may be spaced apart from each other in the first direction DR1. Meanwhile, the display panel 100 and the printed circuit board 300 may be bonded to an upper surface of the COF package 200.

The base film 220 may be a flexible film. The base film 220 may include an upper surface and a lower surface facing or opposite to the upper surface.

The COF package 200 may further include a first signal line SL1, a second signal line SL2, a first signal pad SP1, and a second signal pad SP2. The first signal line SL1 may be connected between the integrated circuit chip 210 and the first signal pad SP1, and the second signal line SL2 may be connected between the integrated circuit chip 210 and the second signal pad SP2.

The integrated circuit chip 210 may be disposed on the upper surface of the base film 220. The integrated circuit chip 210 may receive a driving source voltage and a driving signal from the printed circuit board 300 through the second signal pad SP2 and the second signal line SL2, which are disposed in the second bonding area AR2. The integrated circuit chip 210 may generate a gate signal and a data signal in response to the driving source voltage and the driving signal and may apply the gate and data signals to the first signal pad SP1 through the first signal line SL1. The gate and data signals applied to the first signal pad SP1 may be applied to the display panel 100 (refer to FIG. 1) electrically connected to the first signal pad SP1.

The alignment line AL may be disposed on the upper surface of the base film 220. The alignment line AL may be disposed on a same layer as, e.g., may be coplanar with, the first and second signal lines SL1 and SL2 and may be formed through a same process. The alignment line AL may be spaced apart from the integrated circuit chip 210 in the second direction DR2 and may extend in the first direction DR1.

In FIG. 3, two alignment lines AL are disposed opposite to or to face each other while interposing the integrated circuit chip 210, the second signal line SL2, and the second signal pad SP2 therebetween, but the number of the alignment lines AL should not be considered limited to two. For example, the alignment line AL may be provided in a singular number.

The alignment line AL may include a first alignment mark AM1 at or near an end portion thereof to be aligned with the printed circuit board 300. The first alignment mark AM1 may be formed at a position near to a corner of the base film 220 when viewed in a plan view. The first alignment mark AM1 may be in the second bonding area AR2 in a plan view, an another end portion of the alignment line AL, which is spaced apart from the first alignment mark AM1 in the first direction DR1, may not be in the second bonding area AR2.

The printed circuit board 300 may include a driving board 310, a second alignment mark AM2, and a ground line 320. The second alignment mark AM2 and the ground line 320 may be disposed on a lower surface of the driving board 310. The first and second alignment marks AM1 and AM2 may face each other. The first alignment mark AM1 and the second alignment mark AM2 may be electrically connected to each other when the COF package 200 and the printed circuit board 300 are bonded to each other. An end portion of the second alignment mark AM2 may be connected to the ground line 320. The ground line 320 may make contact with the ground pad 420 (refer to FIGS. 1 and 2) to receive the ground signal.

The heat discharge plate RD may be on the lower surface of the base film 220. The heat discharge plate RD may have a plate shape. Referring to FIG. 6, the heat discharge plate RD may overlap with an area, e.g., a central area, of the COF package 200, except for the first and second bonding areas AR1 and AR2 of the COF package 200, when viewed in a plan view.

The heat discharge plate RD may discharge heat generated in the COF package 200 to the outside of the COF package 200 and may perform a ground function.

The heat discharge plate RD may be formed of a material having high heat conductivity, e.g., silicon resin, ceramic, metal, metal oxide, or metal hydroxide. In an implementation, the heat discharge plate RD may be formed of the metal material, e.g., aluminum, copper, alloy of aluminum and copper, or the like. The metal material may have the heat conductivity higher than the silicon resin and the ceramic. Thus, the heat discharge plate RD formed of the metal material may effectively discharge the heat to the outside of the COF package 200.

When viewed in a plan view, at least one via hole VH may be formed through the base film 220 in the area in which the alignment line AL overlaps with the heat discharge plate RD. At least one via pattern VP may be disposed in the at least one via hole VH. The alignment line AL and the heat discharge plate RD may be electrically connected to each other by the via pattern VP penetrating through the base film 220.

The, e.g., at least one, via pattern VP may not overlap with the first and second bonding areas AR1 and AR2 when viewed in a plan view. In an implementation, the via pattern VP may be provided in a plural number, and the via patterns VP may be spaced apart from each other in the first direction DR1. In FIGS. 3 and 4, four via patterns VP overlap with one alignment line AL, but the number and the shape of the via patterns VP should not be limited there to or thereby.

The first protective layer 230 may be on the upper surface of the base film 220 and the alignment line AL. The first protective layer 230 may help protect the alignment line AL, the first signal line SL1, and the second signal line SL2. The first protective layer 230 may include an exposure hole EH therethrough to expose the first alignment mark AM1, the first signal pad SP1, and the second signal pad SP2. The first alignment mark AM1 may make contact with the second alignment mark AM2 through the exposure hole EH.

The second protective layer 240 may be disposed on the lower surface of the base film 220 and the heat discharge plate RD. For example, the second protective layer 240 may cover the heat discharge plate RD. The second protective layer 240 may help protect the heat discharge plate RD.

The first and second protective layers 230 and 240 may include an insulating material.

Figure 7:
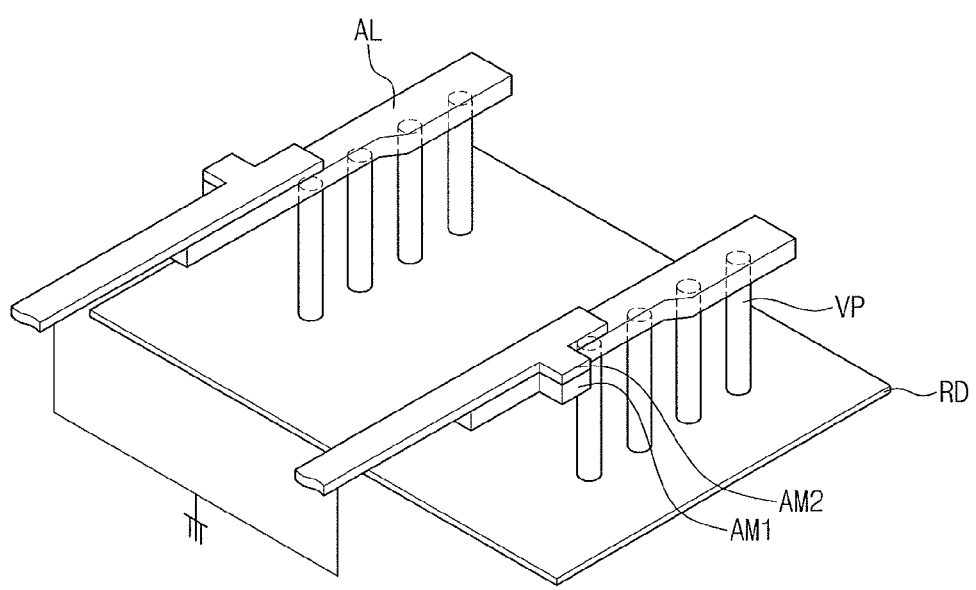
FIG. 7 illustrates a perspective view of an application of a ground signal to the chip-on-film package.

FIG. 7 illustrates a perspective view of an application of a ground signal to the chip-on-film package. FIG. 7 shows only the ground line 320, the second alignment mark AM2, the alignment line AL, the via pattern VP, and the heat discharge plate RD.

Referring to FIGS. 3, 4, and 7, the ground signal applied to the ground pad 420 shown in FIGS. 1 and 2 may be sequentially applied to the ground line 320, the second alignment mark AM2, the alignment line AL, the via pattern VP, and the heat discharge plate RD. The alignment line AL disposed on the upper surface of the base film 220 and the heat discharge plate RD disposed on the lower surface of the base film 220 may be applied with the same ground signal through the via pattern VP. As described above, the alignment line AL on the upper surface of the base film 220 and the heat discharge plate RD on the lower surface of the base film 220 may be grounded through the via pattern VP. Thus, the COF package 200 may have a wider ground contact area when compared to that of other COF packages. Electromagnetic waves generated from the integrated circuit chip 210 or induced to the integrated circuit chip 210 may be blocked by the alignment line AL, the via pattern VP, and the heat discharge plate RD. Thus, interference/radiation of unnecessary and/or undesirable electromagnetic waves between the integrated circuit chip 210 and the other parts or elements may be prevented. In addition, the alignment line AL may be formed by extending the first alignment mark AM1 and may be formed through a same process with the first alignment mark AM1. Thus, additional processes for forming the alignment line AL may not be needed.

Figure 8:
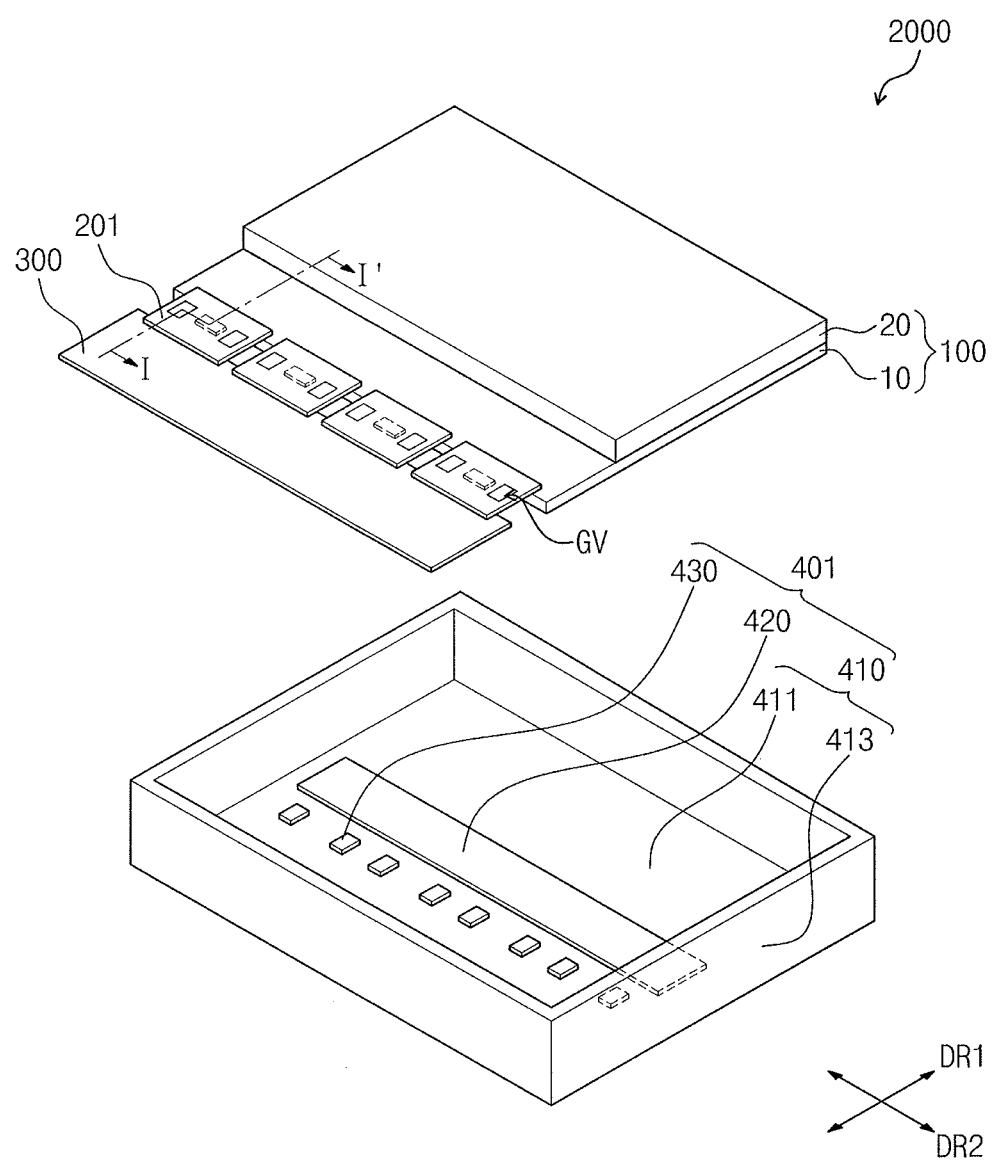
FIG. 8 illustrates an exploded perspective view of a display device according to another exemplary embodiment.
Figure 9:
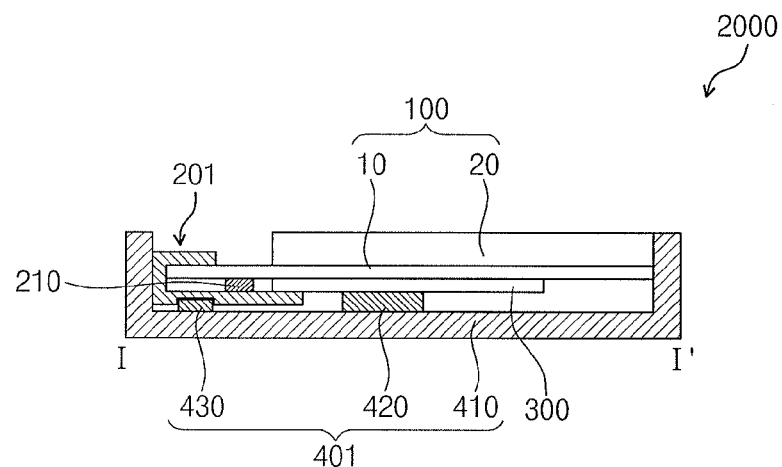
FIG. 9 illustrates a cross-sectional view taken along a line I-I' of FIG. 8.
Figure 10:
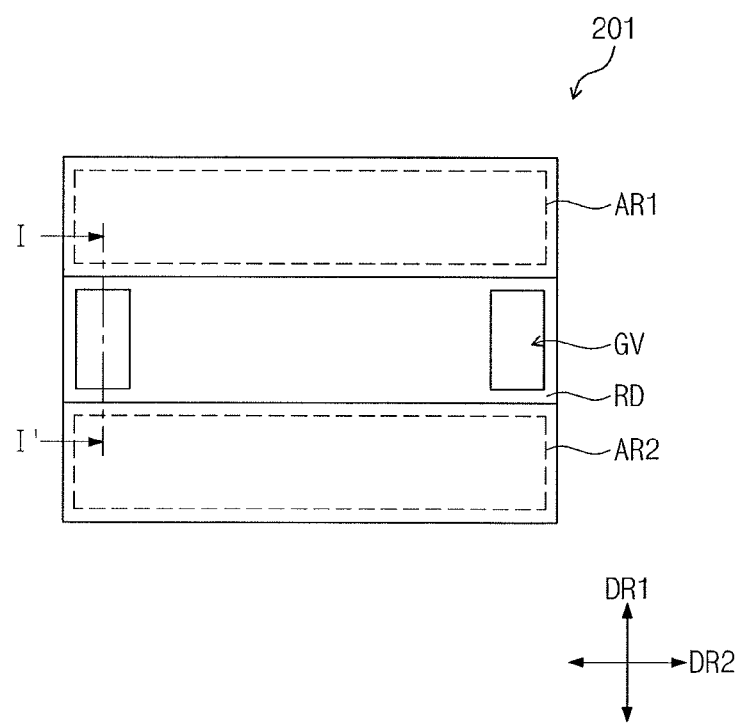
FIG. 10 illustrates a plan view of a rear surface of one chip-on-film package of FIG. 8.
Figure 11:
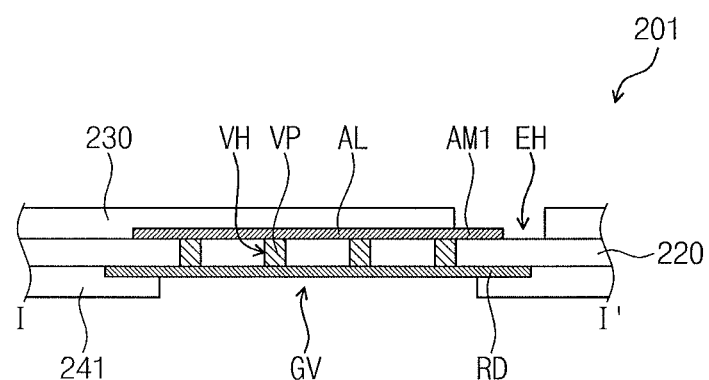
FIG. 11 illustrates a cross-sectional view taken along a line I-I' of FIG. 10.

FIG. 8 illustrates an exploded perspective view showing a display device 2000 according to another exemplary embodiment, FIG. 9 illustrates a cross-sectional view taken along a line I-I' of FIG. 8, FIG. 10 illustrates a plan view showing a rear surface of one COF package 201 of FIG. 8, and FIG. 11 illustrates a cross-sectional view taken along a line I-I' of FIG. 10.

The display device 2000 may have the same general structure and function as those of the display device 1000, except that a heat discharge plate RD may be directly grounded. In FIGS. 8 to 11, the same reference numerals denote the same elements in FIGS. 1 to 6, and thus detailed descriptions of the same elements may be omitted.

Referring to FIGS. 8 to 11, the COF package 201 may include a second protective layer 241. The second protective layer 241 may be disposed on the lower surface of the base film 220 and the heat discharge plate RD. The second protective layer 241 may help the heat discharge plate RD.

The second protective layer 241 may include a recess GV formed therethrough to expose a portion of the heat discharge plate RD. The recess GV may not overlap with the first and second bonding areas AR1 and AR2 when viewed in a plan view. In the present exemplary embodiment, the recess GV has a rectangular shape and two recesses GV are arranged to be spaced apart from each other in the second direction DR2, but the shape and the number of the recesses GV should not be limited thereto or thereby.

The chassis 401 may include a chassis frame 410, a first ground pad 420, and a second ground pad 430. The chassis frame 410 may include a bottom portion 411 and a sidewall portion 413 extending upwardly from the bottom portion 411.

The first ground pad 420 may have a same general shape and function as those of the ground pad 420 shown in FIG. 1, and thus detailed description of the first ground pad 420 will be omitted.

The second ground pad 430 may be disposed on the bottom portion 411 and spaced apart from the first ground pad 421. The second ground pad 430 may overlap with the COF package 201 accommodated in the chassis frame 410 and may make contact with the COF package 201. FIG. 8 shows eight second ground pads 430 spaced apart from each other to respectively correspond to the recesses GV. In this case, the second ground pad 430 may have an area equal to or smaller than that of the recess GV, but it should not be limited thereto or thereby. For example, the second ground pad 430 may have a bar shape and be provided in a singular number.

The second ground pad 430 may make contact with the heat discharge plate RD through the recess GV. The second ground pad 430 may receive the same ground signal as the first ground pad 420. The ground signal may be applied to the heat discharge plate GV from the second ground pad 430.

According to the present exemplary embodiment, the COF package 201 may be grounded through the printed circuit board and may make direct contact with the second ground pad 430 to be grounded. Accordingly, the COF package 201 may be stably grounded since it is grounded through various ways.

By way of summation and review, a COF package may include a base film, wirings on the base film, and an integrated circuit chip on the base film. The COF package may have a ground circuit to block a noise signal coming from the integrated circuit chip or an external noise signal applied to the integrated circuit chip.

In one type of COF package, the ground circuit may be provided on a surface of the base film, and various ground circuits may be used to help improve a grounding function.

The embodiments provide a chip-on-film package having an improved grounding function.

According to an embodiment, the alignment line disposed on the upper surface of the base film may be electrically connected to the heat discharge plate disposed on the lower surface of the base film by the via pattern disposed penetrating through the base film, and thus the grounding function may be improved. In addition, the alignment line may be formed by extending the first alignment mark and formed through a same process with the first alignment mark. Thus, additional processes required to form the alignment line may not be needed. Further, the chip-on-film package may be grounded through the ground pad on the chassis and the printed circuit board.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
    a display panel that displays an image;
    a printed circuit board that drives the display panel;
    a chip-on-film package that electrically connects the printed circuit board to the display panel; and
    a chassis that accommodates the display panel, the printed circuit board, and the chip-on-film package, the chassis applying a ground signal to the printed circuit board,
    wherein the chip-on-film package includes:
    a base film that includes an upper surface and a lower surface, the lower surface facing the upper surface;
    an integrated circuit chip on the upper surface of the base film;
    an alignment line on the base film and being spaced apart from the integrated circuit chip;
    a heat discharge plate on the lower surface of the base film and having a plate shape; and
    at least one via pattern penetrating through the base film and electrically connecting the alignment line to the heat discharge plate.

2. The display device as claimed in claim 1, wherein the alignment line includes a first alignment mark at an end portion thereof.

3. The display device as claimed in claim 2, wherein the printed circuit board includes:
    a driving board; and
    a second alignment mark on the driving board, the second alignment mark facing the first alignment mark and making contact with the first alignment mark.

4. The display device as claimed in claim 3, wherein the printed circuit board further includes a ground line on the driving board, the ground line being electrically connected to the second alignment mark.

5. The display device as claimed in claim 4, wherein the chassis includes:
    a chassis frame that includes a bottom portion and a sidewall portion, the sidewall portion extending upwardly from the bottom portion; and
    a ground pad on the bottom portion, the ground pad making contact with the ground line.

6. The display device as claimed in claim 5, wherein the ground pad is applied with a ground signal.

7. The display device as claimed in claim 2, wherein the alignment line extends in a first direction and is spaced apart from the integrated circuit chip in a second direction, the second direction being different from the first direction when viewed in a plan view.

8. The display device as claimed in claim 7, wherein the at least one via pattern is provided in a plural number of via patterns, and the via patterns are spaced apart from each other in the first direction.

9. The display device as claimed in claim 2, further comprising:
    a first protective layer on the upper surface of the base film and the alignment line, the first protective layer covering the alignment line; and
    a second protective layer on the lower surface of the base film and the heat discharge plate, the second protective layer covering the heat discharge plate.

10. The display device as claimed in claim 9, wherein the first protective layer includes an exposure hole therethrough that exposes the first alignment mark.

11. The display device as claimed in claim 4, wherein the chassis includes:
    a chassis frame that includes a bottom portion and a sidewall portion, the sidewall portion extending upwardly from the bottom portion;
    a first ground pad on the bottom portion, the first ground pad making contact with the ground line; and
    a second ground pad on the bottom portion, the second ground pad being spaced apart from the first ground pad.

12. The display device as claimed in claim 11, wherein the first ground pad and the second ground pad receive a ground signal.

13. The display device as claimed in claim 11, further comprising:
    a first protective layer on the upper surface of the base film and the alignment line, the first protective layer covering the alignment line; and
    a second protective layer on the lower surface of the base film and the heat discharge plate, the second protective layer including a recess therethrough that exposes a portion of the heat discharge plate.

14. The display device as claimed in claim 13, wherein the second ground pad makes contact with the heat discharge plate through the recess.

* * * * *